(12) United States Patent
Adema et al.

(10) Patent No.: US 10,651,159 B2
(45) Date of Patent: May 12, 2020

(54) LIGHT EMITTING DIODE MODULE AND DISPLAY FOR HIDING PHYSICAL GAPS BETWEEN MODULES

(71) Applicant: CHRISTIE DIGITAL SYSTEMS USA, INC., Cypress, CA (US)

(72) Inventors: Daniel Robert Adema, Kitchener (CA); Bryan Hemphill, Waterloo (CA)

(73) Assignee: CHRISTIE DIGITAL SYSTEMS USA, INC., Cypress, CA (US)

( * ) Notice: Subject to any disclaimer, the term of this patent is extended or adjusted under 35 U.S.C. 154(b) by 0 days.

(21) Appl. No.: 15/999,630

(22) Filed: Aug. 20, 2018

(65) Prior Publication Data
US 2020/0058623 A1    Feb. 20, 2020

(51) Int. Cl.
*H01L 25/075* (2006.01)
*H01L 33/62* (2010.01)
*H01L 25/16* (2006.01)

(52) U.S. Cl.
CPC ........ *H01L 25/0753* (2013.01); *H01L 25/167* (2013.01); *H01L 33/62* (2013.01)

(58) Field of Classification Search
CPC .................................................. H01L 25/0753
USPC .......................................................... 257/89
See application file for complete search history.

(56) References Cited

U.S. PATENT DOCUMENTS

| 5,729,276 | A | 3/1998 | Nelson |
| 6,881,946 | B2 | 4/2005 | Cok et al. |
| 7,239,367 | B2 | 7/2007 | Jin et al. |
| 7,495,638 | B2 | 2/2009 | Lamvik et al. |
| 9,123,266 | B2 | 9/2015 | Bastani et al. |
| 9,368,070 | B2 | 6/2016 | Jepsen et al. |
| 9,529,563 | B2 | 12/2016 | Kazmierski et al. |
| 2003/0117545 | A1 | 6/2003 | Coker et al. |
| 2011/0279352 | A1 | 11/2011 | Adema et al. |
| 2018/0054906 | A1* | 2/2018 | Hall ...................... G06F 3/1446 |

FOREIGN PATENT DOCUMENTS

EP    1855149 A1    11/2007

OTHER PUBLICATIONS

EPO, Partial European Search Report, dated Oct. 25, 2019, re European Patent Application No. 19192290.5.
EPO, Extended European Search Report, Mar. 11, 2020, re European Patent Application No. 19192290.5.

\* cited by examiner

*Primary Examiner* — Jami Valentine Miller
(74) *Attorney, Agent, or Firm* — Perry + Currier, Inc.

(57) ABSTRACT

A light emitting diode (LED) module and display for hiding physical gaps between modules is provided. An LED module comprises: a board including at least one edge; and an array of LEDs at the board, the array comprising: first LEDs and second LEDs, smaller than the first LEDs, the second LEDs located along the at least one edge of the board, the first and second LEDs all being at a common pitch distance, adjacent sides of adjacent first LEDs separated by a first distance, and the second LEDs being at a second distance from the at least one edge of the board, the second distance smaller than the first distance. The modules may be incorporated into an LED display.

9 Claims, 5 Drawing Sheets

LIGHT EMITTING DIODE MODULE AND DISPLAY FOR HIDING PHYSICAL GAPS BETWEEN MODULES

BACKGROUND

When a light emitting diode (LED) module has to be replaced in an LED display, damage to adjacent LED modules frequently occurs. For example, edges of adjacent LED modules physically interact with each other during the replacing, causing the damage. Hence, a distance between an edge of an LED module and edge LEDs is generally selected such that, when the LED modules are arranged into an LED display, there is a physical gap between the LED modules, while maintaining a common pitch between the LEDs of the LED display. Such physical gaps may hence reduce the possibility of damage occurring to LED modules during replacement of an LED module. Furthermore, as a size of a physical gap increases, the possibility of damage generally decreases. However, there are limits to the distance between an edge of an LED module and edge LEDs, and hence also limits to the size of the physical gap between LED modules.

BRIEF DESCRIPTIONS OF THE DRAWINGS

For a better understanding of the various embodiments described herein and to show more clearly how they may be carried into effect, reference will now be made, by way of example only, to the accompanying drawings in which.

DETAILED DESCRIPTION

An aspect of the specification provides a light emitting diode (LED) module comprising: a board including at least one edge; and an array of LEDs at the board, the array of LEDs comprising: first LEDs and second LEDs, smaller than the first LEDs, the second LEDs located along the at least one edge of the board, the first LEDs and the second LEDs all being at a common pitch distance, adjacent sides of adjacent first LEDs separated by a first distance, and the second LEDs being at a second distance from the at least one edge of the board, the second distance smaller than the first distance.

Another aspect of the specification provides a light emitting diode display comprising: light emitting diode (LED) modules, the LED modules each separated by a respective physical gap between the LED modules, each of the LED modules comprising first LEDs and second LEDs, the second LEDs located at the respective physical gap, the second LEDs being smaller than the first LEDs, the first LEDs and the second LEDs all being at a common pitch distance at a respective LED module, a size of the respective physical gap selected to one or more of: maintain the common pitch distance between the second LEDs of adjacent LED modules when the LED modules are at an operating temperature; and increase a respective pitch distance between the second LEDs of the adjacent LED modules, relative to the common pitch distance, when the LED modules are in an off-state, such that the respective pitch distance decreases towards the common pitch distance due to heat expansion of the LED modules when the LED modules are in an on-state and at the operating temperature.

Figure 1:
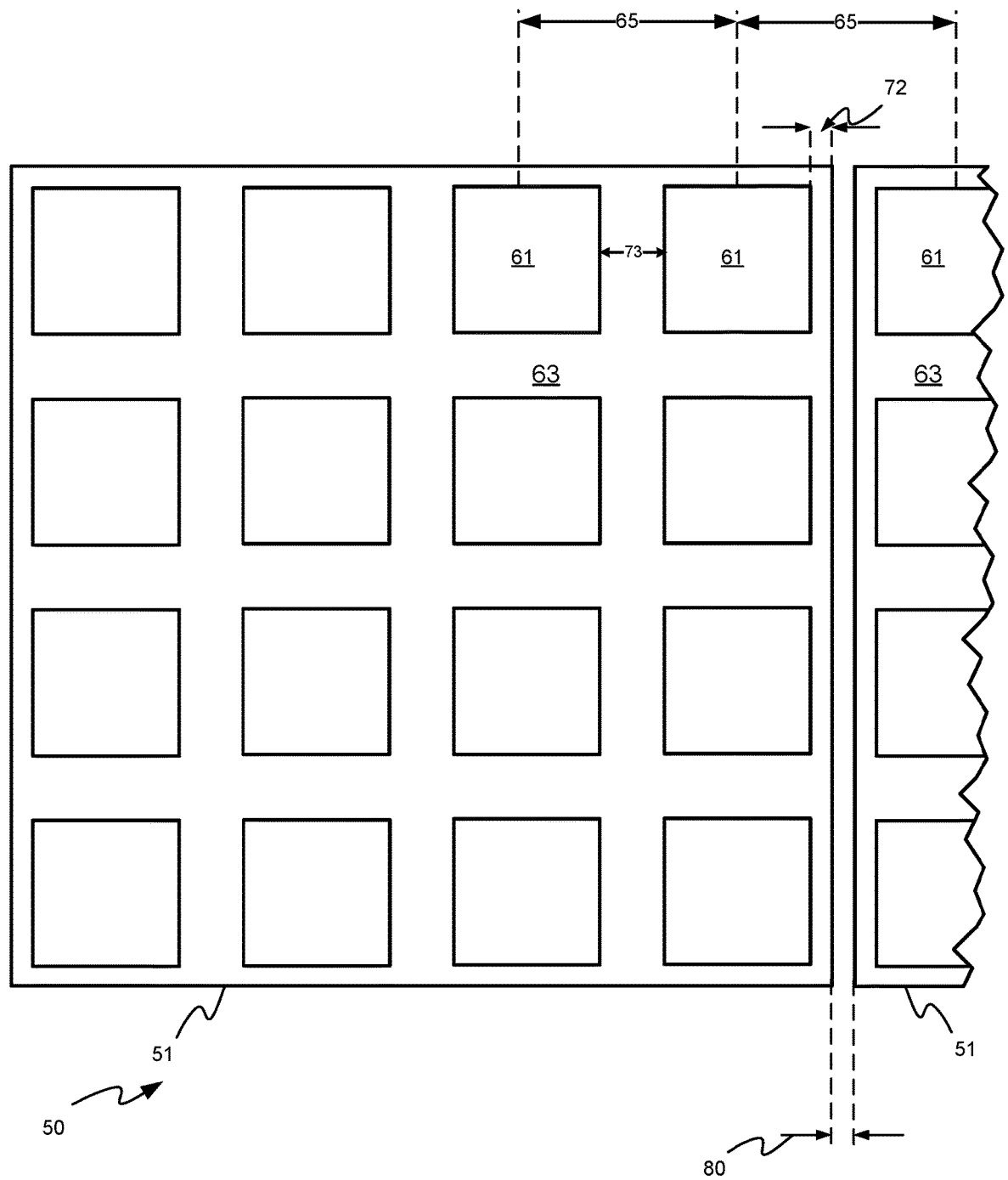
FIG. 1 depicts is a schematic view of an example light emitting diode display according to the prior art.

Attention is first directed to FIG. 1 which depicts an example light emitting diode (LED) display 50, according the prior art, that includes two adjacent LED modules 51, (however only a portion of a right-most LED modules 51 is depicted). While only two LED modules 51 are depicted, the LED display 50 may include more than two LED modules 51. Each of the LED modules 51 are substantially similar, each comprising respective LEDs 61 arranged in respective arrays, for example in rows and columns. As depicted, in FIG. 1, the LEDs 61 of each of the LED modules 51 are all the same size and are arranged on a board 63 of an LED module 51 according to a pitch distance 65, for example a lateral center-to-center distance between the LEDs 61. While each LED module 51 includes only sixteen LEDs 61, arranged in a 4×4 array on a square board 63, each LED module 51 may include any suitable number of LEDs 61 arranged in an array of any suitable dimensions and on a board of any suitable dimensions (and which need not be square).

Furthermore, while the LEDs 61 are depicted as monolithic squares, it is understood that each of the LEDs 61 may comprise a plurality of LEDs, for example, one or more red LEDs, one or more green LEDs and one or more blue LEDs, in an LED package, and the like. Hence, it is understood that LED 61 may represent an LED package, and the like, connected to a respective solder board and/or any other suitable wiring, which connects each LED 61 to one or more display drivers, and the like.

As also depicted in FIG. 1, there is a lateral distance 72 between an edge of each LED module 51 (e.g. an edge of the board 63) and an edge LED 61 (e.g. an LED 61 adjacent an edge of the board 63). Furthermore, there is a lateral distance 73 between adjacent LEDs 61 in each row and column of an array, at each of the LED modules 51. Furthermore, the LED modules 51 are arranged such that the pitch distance 65 is maintained between edge LEDs 61 of the adjacent LED modules 51. Hence, the lateral distance 72, between an edge of each LED module 51 and an edge LED 61, must be no greater than half of the lateral distance 73 between adjacent lateral LEDs 61, otherwise a pitch between the edge LED 61 of the adjacent LED modules 51 would be greater than the pitch distance 65.

However, as depicted, there is a physical gap 80 between the adjacent LED modules 51; in order to have the physical gap 80, the lateral distance 72 must be less than half of the lateral distance 73. Hence, while it is preferred to make the physical gap 80 as large as possible, there is a limit to the physical gap 80 as defined by the lateral distance 72, for example due to solder boards and/or other wiring of each edge LED 61 and/or a size of the edge LEDs 61.

Figure 2:
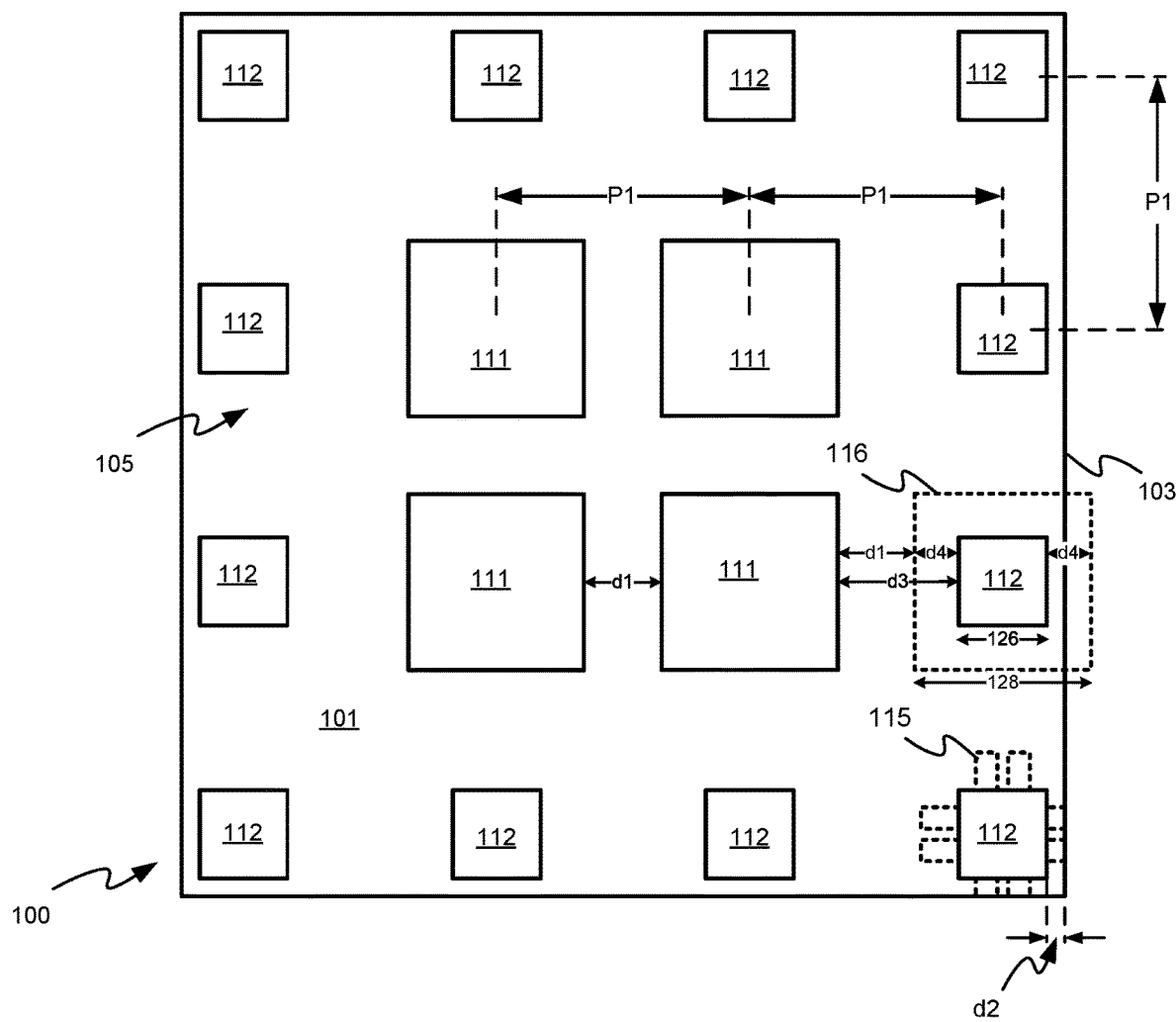
FIG. 2 depicts is a schematic view of an example light emitting diode module, according to non-limiting examples.

Attention is hence next directed to FIG. 2, which depicts an example LED module 100 which may be used in an LED display to form larger physical gaps between adjacent LED modules as compared to the LED display 50 of FIG. 1.

The LED module 100 comprises: a board 101 including at least one edge 103; an array 105 of LEDs at the board 101, the array 105 of LEDs comprising; first LEDs 111 and second LEDs 112, smaller than the first LEDs 111, the second LEDs 112 along the at least one edge 103 of the board 101, the first LEDs 111 and the second LEDs 112 all being at a common pitch distance P1, adjacent sides of adjacent first LEDs 111 separated by a first distance d1, and the second LEDs 112 being at a second distance d2 from the at least one edge 103 of the board 101, the second distance d2 smaller than the first distance d1 and/or less than half of the first distance d1.

As depicted, the array 105 comprises the LEDs 111, 112 arranged in rows and columns of the array 105, and the common pitch distance P1 comprises a lateral center-to-center distance between adjacent LEDs 111, 112 in each of the rows and columns of the array 105. As with the prior art LED display 50, while the LED module 100 includes only sixteen LEDs 111, 112, arranged in a 4×4 array on a square board 101, the LED module 100 may include any suitable number of LEDs 111, 112 arranged in an array of any suitable dimensions and on a board of any suitable dimensions (and which need not be square).

Furthermore, while only one edge 103 of the board 101 is indicated, in general the board 101 comprises four edges, with the second LEDs 112 being arranged along each of the four edges. Hence, the second LEDs 112 may alternatively be referred to as edge LEDs while the first LEDs 111 may alternatively be referred to as interior LEDs, with edge LEDs being smaller than interior LEDs.

However, in other examples the indicated edge 103 may be specifically configured to form a physical gap with an adjacent LED module (e.g. see FIG. 3) and the smaller second LEDs 112 may be located only along this edge 103, with the depicted second LEDs 112 located along the other edges replaced with the larger first LEDs 111.

Each of the LEDs 111, 112 is generally understood to comprise an LED package and which may include one or more LEDs mounted thereupon (e.g. one or more red LEDs, one or more green LEDs and one or more blue LEDs), connected to a respective solder board and/or any other suitable wiring, which may connect each LED 111, 112 to one or more display drivers (e.g. of an LED display), and the like. While only one solder board 115 is depicted in dashed lines (e.g. at a second LED 112 in the lower right of FIG. 1), it is understood that each of the LEDS 111, 112 include a respective solder board 115.

The first LEDs 111 may be the same and/or similar to the LEDs 61 of the prior art LED display 50, however the second LEDs 112 are generally smaller than the first LEDs 111. To show the difference in size, an outline 116 of a first LED 111 is depicted around one of the second LEDs 112, the outline 116 centered on the second LED 112.

For example, the second LEDs 112 may be similar to the first LEDs 111, but having a smaller LED package, and/or having fewer red, green and blue LEDs mounted thereto, and hence a smaller physical foot print as the first LEDs 111.

In some examples, the first LEDs 111 may each comprise an "0808" package (e.g. 0.8 mm×0.8 mm), while the second LEDs 112 may each comprise an "0606" package (e.g. 0.6 mm×0.6 mm). In these examples, the pitch distance P1 may be about 1.25 mm. However in other examples, other types of LED packages may be used, and the pitch distance may be as low as 0.7 mm, however any suitable LED package and any suitable pitch distance P1 is within the scope of present examples. Furthermore, while such "0808" and "0606" packages are generally square, and while the LEDs 111, 112 are also depicted as square, the LEDS 111, 112 need not be square, and may be any suitable shape.

The second distance d2 from the at least one edge 103 of the board 101 to the second LEDs 112 is selected to one or more of: minimize the second distance d2 without affecting operation of the second LEDs 112; and cut into respective solder boards 115 of the second LEDs 112 without affecting the operation of the second LEDs 112. For example, it is understood that each respective solder board 115 of the second LEDs 112 may be cut into to reduce the distance d2 between the at least one edge 103 of the board 101 to the second LEDs 112; however, after removing a given amount of a solder board 115, electrical connections to a second LED 112 will generally be damaged and the second LED 112 may not operate. Hence, the second distance d2 is selected to cut into the solder boards 115 while not affecting operation of the second LEDs 112.

FIG. 2 also depicts a third distance and/or a lateral distance d3 between the second LEDs 112 and the first LEDs 111. The lateral distance d3 is generally greater than the lateral distance d1 between the first LEDs 111 due to the smaller package size of the second LEDs 112 and the pitch distance P1 being common to the LEDS 111, 112. Put another way, as the second LEDs 112 are smaller than the first LEDs 111, to maintain the pitch distance P1 between an adjacent first LED 111 and an adjacent second LED 112, the lateral distance d3, between an adjacent first LED 111 and an adjacent second LED 112 is generally larger than the lateral distance d1 between adjacent first LEDs 111.

For example, a lateral square dimension (e.g. a length of a side of a respective square) of the second LEDs 112 may be a distance 126 (e.g. 0.6 mm), and a lateral square dimension of the first LEDs 111 may be a distance 128 (e.g. 0.8 mm). Hence, a lateral distance d4 between the edge of the second LED 112 and the outline 116 represents twice the difference between the distance 128 and the distance 126 (e.g. distance d4=½(distance 128–distance 126).

In general, the location of the outline 116 represents where a first LED 111 would be placed if used at the edge 103 in place of the second LED 112, as in the prior art LED display 50.

Hence, comparing the placement of an edge-most side of the second LED 112 surrounded by the outline 116, with the edge-most side of the outline 116, it is apparent that the edge-most side of the second LEDs 112 are recessed by the distance d4 on the board 101, as compared to when the larger LEDs 111 are at the edge 103.

Hence, as the second LEDs 112 are smaller than the first LEDs 111, a length of the board 101 (e.g. from the at least one edge 103 to an opposite edge) may be reduced by the distance d4 as compared to board 63 of the prior art LED display 50, but with same LED density as the prior art LED display 50.

Indeed, when the second LEDs 112 are also arranged on the edge of the board 101 opposite the at least one edge 103, the length of the board 101 may be reduced by twice the distance d4 (as compared to the board 63 of the prior art LED display 50, but with the same LED density) due a reduction by the distance d4 on each of the edges.

Regardless, a physical gap between adjacent LED modules 100 used to form an LED display may be larger than the physical gap 80 between LED modules 51 of the prior art LED display 50, for example by at least the distance d4.

Furthermore, in some examples, the second LEDs 112 may be configured to be driven at a respective brightness different from a brightness of the first LEDs 111, the respective brightness of the second LEDs 112 being one or more of: greater than the brightness of the first LEDs 111; less than the brightness of the first LEDs 111; and dependent on a respective pitch distance from respective second LEDs at an adjacent LED module.

Figure 3:
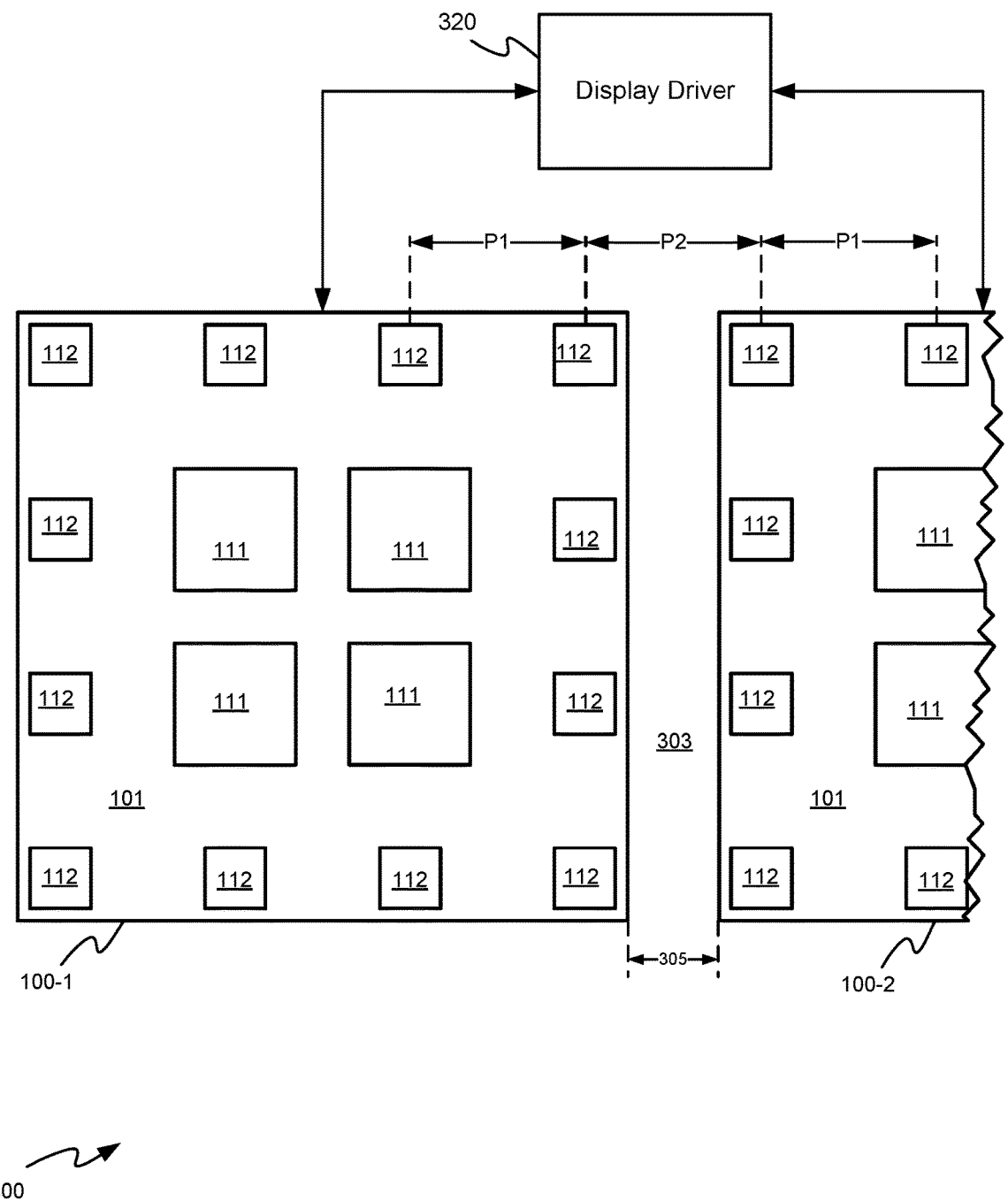
FIG. 3 depicts is a schematic view of an example light emitting diode display, according to non-limiting examples.

For example, attention is next directed to FIG. 3 which depicts an LED display 300 comprising: LED modules 100 (e.g. each of two LED modules 100-1, 100-2 similar to the LED module 100 of FIG. 2, with like components having like numbers), the LED modules 100 each separated by a respective physical gap 303 between the LED modules 100, each of the LED modules 100 comprising first LEDs 111 and second LEDs 112, the second LEDs 112 located at the respective physical gap 303, the second LEDs 112 being smaller than the first LEDs 111, the first LEDs 111 and the second LEDs 112 all being at a common pitch distance P1 at a respective LED module 100, a size of the respective physical gap 303 (e.g. a distance 305) selected to one or more of: maintain the common pitch distance P1 between the second LEDs 112 of adjacent LED modules 100 when the LED modules 100 are at an operating temperature; and increase a respective pitch distance P2 between the second LEDs 112 of the adjacent LED modules 100, relative to the common pitch distance P1, when the LED modules 100 are in an off-state, such that the respective pitch distance P2 decreases towards the common pitch distance P1 due to heat expansion of the LED modules 100 when the LED modules 100 are in an on-state and at the operating temperature.

In some examples, the respective pitch distance P2 may decreases towards the common pitch distance P1 and past the common pitch distance P1 such that the respective pitch distance P2 is less than the common pitch distance P1 at the operating temperature, as described below.

While not depicted, it is understood that each of the boards 101 may be mounted to a frame, and the like, of the LED display 300, the frame configured to hold the LED modules 100, separated by the physical gap 303.

In general, a size of the physical gap 303 is greater than a size of the physical gap between the LED modules 51 of the prior art LED display 50, for example by at least the distance d4, as described above.

As depicted, the LED display 300 includes only two LED modules 100 (with only a portion of the second LED module 100-2 depicted), however, the LED display 300 may include any number of LED modules 100 arranged adjacent to each other and separated by respective physical gaps similar to the respective physical gap 303. For example, the LED display 300 may comprise an array of LED modules 100.

As depicted, the LEDs 111, 112 of the LED display 300 are driven by a display driver 320 (which may include one or more display drivers), which may drive the LEDs 111, 112 according to image and/or video data. In general, the display driver 320 may comprise a computing device, and/or be a component of computing device, configured to drive the LED display 300.

The display driver 320 may hence drive each of the LEDs 111, 112 independent of one another to form an image and the like at the LED display 300. The second LEDs 112 may be driven at a respective brightness different from a brightness of the first LEDs 111, the respective brightness of the second LEDs 112 being one or more of: greater than the brightness of the first LEDs 111; less than the brightness of the first LEDs 111; and dependent on the respective pitch distance P2 at the operating temperature.

As depicted, the second LEDs 112 at adjacent edges of the LED modules 100 are at a respective pitch distance of P2, which may be the same or different as the common pitch distance P1 of a respective LED module 100. Furthermore, the distance 305 between adjacent edges of the LED modules 100 may change when the LED display 300 is turned on, and the LEDs 111, 112 emit heat, thereby causing the boards 101 to heat up. For example, as the boards 101 heat up, the boards 101 generally expand towards each other, and hence the physical gap 303 and/or the distance 305 may decrease. Hence, brightness of the second LEDs 112 may be adjusted to compensate for a difference between the respective pitch distance P2 over the respective physical gap 303 and the common pitch distance P1 of one of the LED modules 100.

Figure 4:
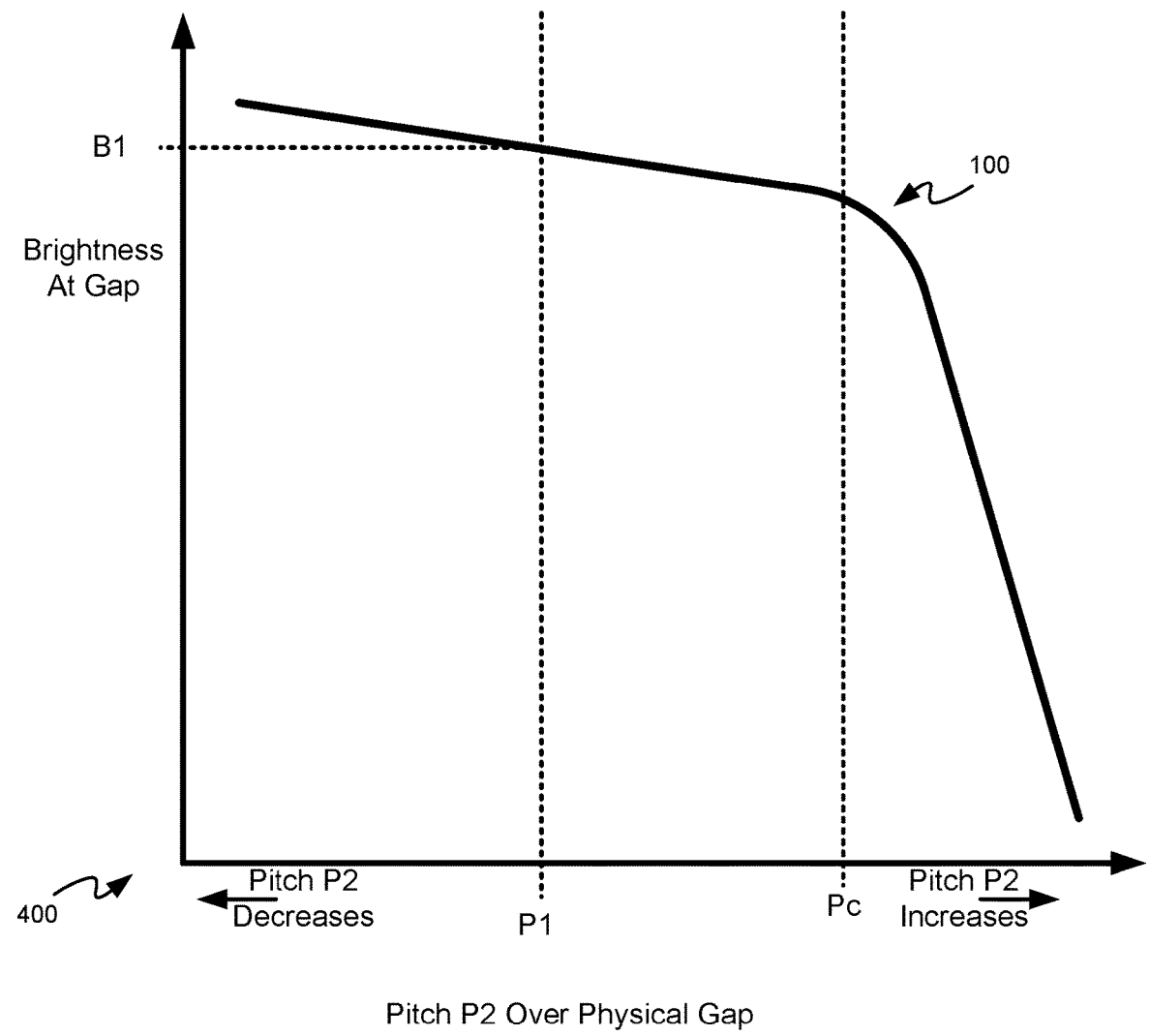
FIG. 4 depicts a graph of brightness at a physical gap of an example light emitting diode display as the pitch over a physical gap between light emitting display modules changes, according to non-limiting examples.

Attention is directed to FIG. 4 which depicts a graph 400 showing how brightness over the respective physical gap 303 changes as the respective pitch distance P2 over the respective physical gap 303 increases and decreases, for example when the second LEDs 112 are nominally driven at the same brightness as the first LEDs 111 of each of the LED module 100.

For example, as the respective pitch distance P2 over the respective physical gap 303 decreases, the brightness over the respective physical gap 303 increases, for example as the second LEDs 112 of adjacent LED modules 100 get closer to each other. Similarly, as the respective pitch distance P2 over the respective physical gap 303 increases, the brightness over the respective physical gap 303 decreases, for example as the second LEDs 112 of adjacent LED modules 100 get further away from each other. Hence, changes in the size of the physical gap 303, and/or the distance 305, can lead to visible discontinuities in brightness in images rendered at the LED display 300, the discontinuities at the edges of the LED modules 100. To reduce and/or remove such discontinuities, the second LEDs 112 may be driven at a different brightness than the first LEDs 111.

For example, the graph 400 also shows the common pitch distance P1 and the brightness B1 at the common pitch distance P1. In general, the brightness B1 represents a driving brightness of the second LEDs 112 at which the second LEDs 112 appear to be at a same brightness as the first LEDs 111 of a respective LED module 100. In general, when the respective pitch distance P2 is at the common pitch distance P1, the second LEDs 112, may be driven at the same brightness as the first LEDs 111.

However, when the respective pitch distance P2 is less than the common pitch distance P1, the second LEDs 112, may be driven at a brightness lower than the first LEDs 111 to compensate for the second LEDs 112 of adjacent LED modules 100 being closer together than first LEDs 111 of a respective LED module 100. Similarly, when the respective pitch distance P2 is greater than the common pitch distance P1, the second LEDs 112, may be driven at a brightness higher than the first LEDs 111 to compensate for the second LEDs 112 of adjacent LED modules 100 being further apart than first LEDs 111 of a respective LED module 100.

However, once the respective pitch distance P2 exceeds a critical pitch Pc, the brightness over the respective physical gap 303 critically decreases such that the second LEDs 112 may not be able to compensate for the discontinuities, even when driven at a maximum brightness. Hence, in general, the respective pitch distance P2 is selected to be less than such a critical pitch Pc. In particular, the respective pitch distance P2 may be selected such that the respective pitch distance P2 is less than the critical pitch Pc at ambient temperature (e.g. room temperature and/or about 20° C.) such that at an operating temperature, greater than ambient temperature, the respective gap decreases further away from the critical pitch Pc.

Indeed, a size of the respective physical gap 303 may be selected to maintain the common pitch distance P1 between the second LEDs 112 of adjacent LED modules 100 when the LED modules 100 are at an operating temperature. Hence, the size of the respective physical gap 303 may be selected such that the respective pitch distance P2 is greater than the common pitch distance P1 at ambient temperature, but decreases to the common pitch distance P1 at an operating temperature.

Hence, in general, a size of the respective physical gap 303 may be selected increase the respective pitch distance P2 between the second LEDs 112 of the adjacent LED modules 100, relative to the common pitch distance P1, when the LED modules 100 are in an off-state (e.g. at an ambient temperature), such that the respective pitch distance P2 decreases towards the common pitch distance P1 due to heat expansion of the LED modules 100 when the LED modules are in an on-state and at the operating temperature.

In some examples, however, the size of the respective physical gap 303 is selected to: increase the respective pitch distance P2 between the second LEDs 112 of the adjacent LED modules 100, relative to the common pitch distance P2, when the LED modules 100 are in the off-state, such that the respective pitch distance P2 decreases to less than the common pitch distance P2 due to heat expansion of the LED modules 100 when the LED modules 100 are in the on-state and at the operating temperature.

For example, when the respective pitch distance P2 is less than the common pitch distance P2 at the operating temperature, the second LEDs 112 may be driven at a brightness lower than the first LEDs 111 thereby driving the LED display 300 at an overall lower energy than when the second LEDs 112 are driven at the same or higher brightness as the first LEDs 111, and furthermore increasing the life of the second LEDs 112.

Figure 5:
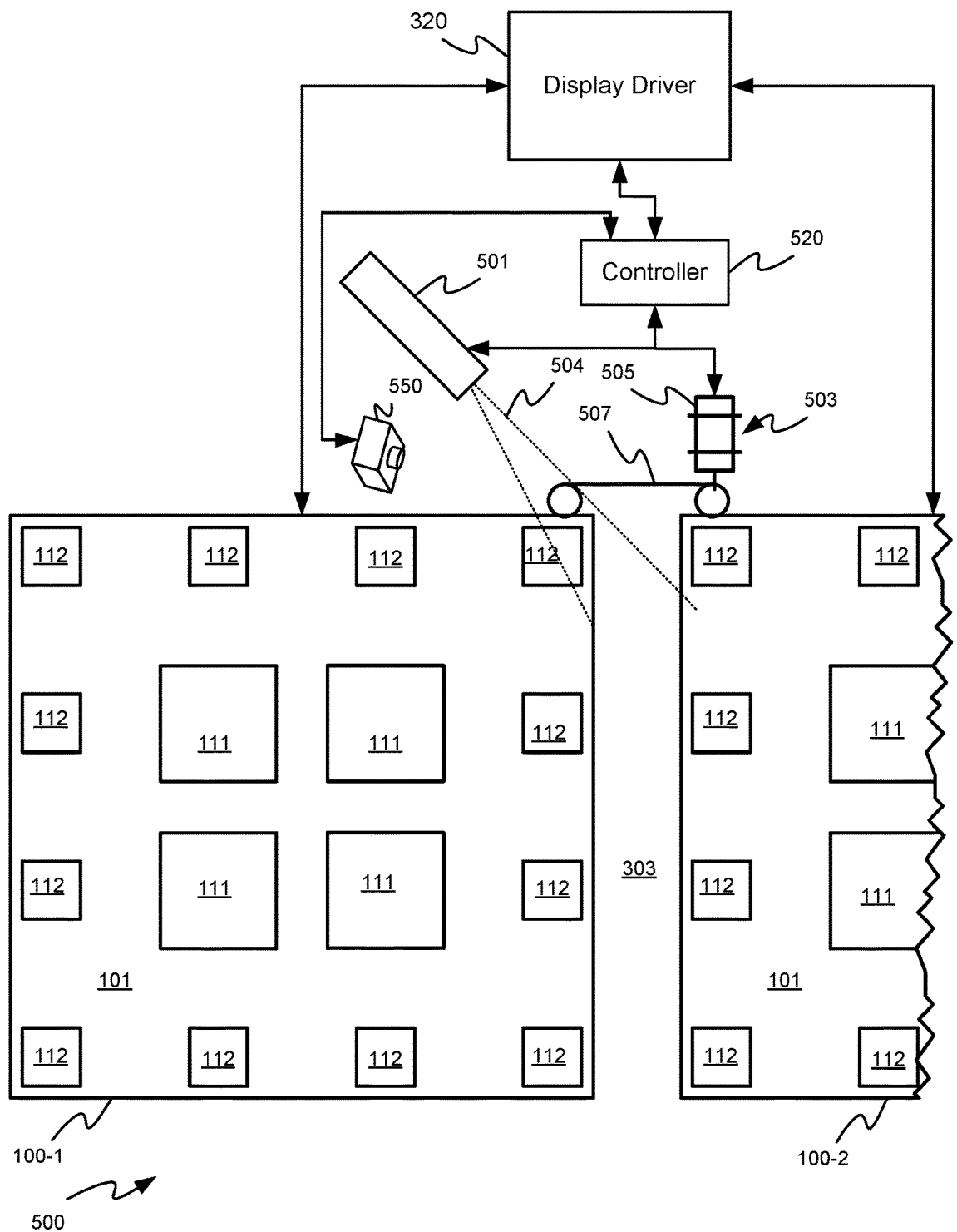
FIG. 5 depicts is a schematic view of an example light emitting diode display with dynamic adjustment of a physical gap between light emitting display modules, according to non-limiting examples.

In yet further examples, the LED display 300 may be adapted to dynamically adjust the respective physical gap 303 between the LED modules 100, For example, attention is next directed to FIG. 5 which depicts an LED display 500 similar to the LED display 300, with like components having like numbers. Hence, the LED display 500 comprises the two adjacent LED modules 100 with respective LEDs 111, 112, the two adjacent LED modules 100 separated by the respective physical gap 303.

However, in contrast to the LED display 300, the LED display 500 further comprises a measurement device 501 configured to measure the respective physical gap 303 between at least two of the LED modules 100; and a physical gap adjustment apparatus 503 configured to dynamically adjust the respective physical gap 303 between at least two of the LED modules 100 based on measurements of the measurement device 501.

For example, the measurement device 501 may comprise one or more of a non-touch measurement device and (as depicted) a retro-reflective laser measurement device that uses a laser beam 504 to scan the respective physical gap 303.

The physical gap adjustment apparatus 503 may comprise a stepper motor 505 and a rack-and-pinion apparatus 507 (depicted schematically), and the like, configured to move one or more of the LED modules 100 relative to each other to adjust the respective physical gap 303.

It is understood that, in these examples, a frame of the LED display 500 may be adapted to enable the LED modules 100 to move on tracks, and the like, when moved by the physical gap adjustment apparatus 503.

Hence, while a particular example of the measurement device 501 and the physical gap adjustment apparatus 503 is depicted in FIG. 5, any suitable measurement device 501 and/or the physical gap adjustment apparatus 503 for measuring and adjusting the respective physical gap 303 is within the scope of present examples.

As depicted, the LED display 500 further comprises a controller 520 in communication with the measurement device 501 and the physical gap adjustment apparatus 503, the controller 520 configured to receive measurements of the respective physical gap 303 from the measurement device 501 and adjust the respective physical gap 303 accordingly by controlling the stepper motor 505.

In some examples, as depicted, the controller 520 may be in communication with the display driver 320 such that the size of the respective physical gap 303, as measured and/or adjusted by the measurement device 501 and the physical gap adjustment apparatus 503, may be coordinated with the brightness of the second LEDs 112, for example based on the graph 400.

Indeed, in yet further examples, as depicted the LED display 500 may include an apparatus 550 for measuring the discontinuities in images of the LED display 500, such as a camera, and the like, the discontinuities due to changes in brightness across the respective physical gap 303 between the LED modules 100. As depicted, the apparatus 550 is in communication with the controller 520; and/or the apparatus 550 alternatively may be in communication with the display driver 320. Regardless, the display driver 320 and/or the controller 520 may be further configured to adjust the brightness of the second LEDs 112, and/or adjust the size of the respective physical gap 303 based on measurements of the respective physical gap 303 from the measurement device 501 and/or measurements of the brightness of images (e.g. discontinues) of the led display 500 from the apparatus 550.

Provided herein is a light emitting diode module and light emitting diode display for hiding physical gaps between light emitting diode module modules. Edge LEDs of an LED module that are to be adjacent a physical gap in an LED display are smaller than LEDS that are not to be adjacent the physical gap. Furthermore, the brightness of the edge LEDs may be controlled based on the size of the physical gap.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

The terms "about", "substantially", "essentially", "approximately", and the like, are defined as being "close to", for example as understood by persons of skill in the art. In some embodiments, the terms are understood to be "within 10%," in other embodiments, "within 5%", in yet further embodiments, "within 1%", and in yet further embodiments "within 0.5%".

Persons skilled in the art will appreciate that in some embodiments, the functionality of devices and/or methods and/or processes described herein can be implemented using pre-programmed hardware or firmware elements (e.g., application specific integrated circuits (ASICs), electrically erasable programmable read-only memories (EEPROMs), etc.), or other related components. In other embodiments, the functionality of the devices and/or methods and/or processes described herein can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

Persons skilled in the art will appreciate that there are yet more alternative embodiments and modifications possible, and that the above examples are only illustrations of one or more embodiments. The scope, therefore, is only to be limited by the claims appended hereto.

What is claimed is:

1. A light emitting diode (LED) module comprising:
a board including at least one edge; and
an array of LEDs on the board, the array of LEDs comprising: first LEDs and second LEDs, smaller than the first LEDs,
the second LEDs located along the at least one edge of the board,
the first LEDs and the second LEDs all being at a common pitch distance,
adjacent sides of adjacent first LEDs separated by a first distance, and
the second LEDs being at a second distance from the at least one edge of the board, the second distance smaller than the first distance.

2. The light emitting diode module of claim 1, wherein the second distance from the at least one edge of the board to the second LEDs is selected to one or more of: minimize the second distance without affecting operation of the second LEDs; and cut into respective solder boards of the second LEDs without affecting the operation of the second LEDs.

3. The light emitting diode module of claim 1, wherein the second LEDs are configured to be driven at a respective brightness different from a brightness of the first LEDs, the respective brightness being one or more of:
greater than the brightness of the first LEDs;
less than the brightness of the first LEDs; and
dependent on a respective pitch distance from respective second LEDs at an adjacent LED module.

4. The light emitting diode module of claim 1, wherein the at least one edge is configured to form a physical gap with an adjacent LED module.

5. A light emitting diode display comprising:
light emitting diode (LED) modules,
the LED modules each separated by a respective physical gap between the LED modules,
each of the LED modules comprising first LEDs and second LEDs, the second LEDs located on a respective LED module at the respective physical gap, the second LEDs being smaller than the first LEDs, the first LEDs and the second LEDs all being at a common pitch distance on the respective LED module,
a size of the respective physical gap selected to one or more of:
maintain the common pitch distance between the second LEDs of adjacent LED modules when the LED modules are at an operating temperature; and
increase a respective pitch distance between the second LEDs of the adjacent LED modules, relative to the common pitch distance, when the LED modules are in an off-state, such that the respective pitch distance decreases towards the common pitch distance due to heat expansion of the LED modules when the LED modules are in an on-state and at the operating temperature.

6. The light emitting diode display of claim 5, wherein the second LEDs are configured to be driven at a respective brightness different from a brightness of the first LEDs, the respective brightness being one or more of:
greater than the brightness of the first LEDs;
less than the brightness of the first LEDs; and
dependent on the respective pitch distance at the operating temperature.

7. The light emitting diode display of claim 5, wherein the size of the respective physical gap is selected to:
increase the respective pitch distance between the second LEDs of the adjacent LED modules, relative to the common pitch distance, when the LED modules are in the off-state, such that the respective pitch distance decreases to less than the common pitch distance due to heat expansion of the LED modules when the LED modules are in the on-state and at the operating temperature.

8. The light emitting diode display of claim 5, further comprising:
a measurement device configured to measure the respective physical gap between at least two of the LED modules; and
a physical gap adjustment apparatus configured to dynamically adjust the respective physical gap between at least two of the LED modules based on measurements of the measurement device.

9. The light emitting diode display of claim 8, wherein the measurement device comprises one or more of a non-touch measurement device and a retro-reflective laser measurement device.

* * * * *